(12) United States Patent
Aoyama et al.

(10) Patent No.: US 7,714,498 B2
(45) Date of Patent: May 11, 2010

(54) ELECTROLUMINESCENT DEVICE WITH ACETYLACETONATO COMPLEX SALT INCLUDED IN PHOSPHOR LAYER

(75) Inventors: Toshiyuki Aoyama, Osaka (JP); Masayuki Ono, Osaka (JP); Shogo Nasu, Hyogo (JP); Masaru Odagiri, Hyogo (JP)

(73) Assignee: Panasonic Corporation, Osaka (JP)

( * ) Notice: Subject to any disclaimer, the term of this patent is extended or adjusted under 35 U.S.C. 154(b) by 290 days.

(21) Appl. No.: 11/628,767

(22) PCT Filed: Jun. 3, 2005

(86) PCT No.: PCT/JP2005/010243

§ 371 (c)(1),
(2), (4) Date: Dec. 7, 2006

(87) PCT Pub. No.: WO2005/122649

PCT Pub. Date: Dec. 22, 2005

(65) Prior Publication Data

US 2008/0048555 A1 Feb. 28, 2008

(30) Foreign Application Priority Data

Jun. 7, 2004 (JP) .............................. 2004-168168

(51) Int. Cl.
*H01J 1/62* (2006.01)
*H01J 63/04* (2006.01)

(52) U.S. Cl. ...................... 313/503; 313/498; 313/506; 313/512; 428/690

(58) Field of Classification Search ......... 313/498–512; 428/690
See application file for complete search history.

(56) References Cited

U.S. PATENT DOCUMENTS 5,643,685 A 7/1997 Torikoshi (Continued)

FOREIGN PATENT DOCUMENTS

CN 1291068 A 4/2001

(Continued)

OTHER PUBLICATIONS

International Preliminary Report on Patentability issued in International Application No. PCT/JP2005/010243, dated Dec. 28, 2006.

(Continued)

*Primary Examiner*—Bumsuk Won
*Assistant Examiner*—Kevin Quarterman
(74) *Attorney, Agent, or Firm*—McDermott Will & Emery LLP

(57) ABSTRACT

An electroluminescent device having a phosphor layer including a phosphor material and a pair of electrodes for applying a voltage to the foregoing phosphor layer wherein an acetylacetonato complex salt is included in the phosphor layer to realize an electroluminescent device with high luminance. Further, the EL device realizes an electroluminescent device with higher luminance by constructing the foregoing phosphor layer so as to contain acetylacetonato complex salt, in which ligands coordinate with a trivalent metal atom, particularly a metal atom of Group III or Group XIII as the foregoing acetylacetonato complex salt.

6 Claims, 1 Drawing Sheet

U.S. PATENT DOCUMENTS

| | | | |
|---|---|---|---|
| 5,707,745 A | | 1/1998 | Forrest et al. |
| 2003/0085384 A1* | | 5/2003 | Burnell-Jones ........ 252/301.36 |
| 2003/0129451 A1* | | 7/2003 | Nukada et al. .............. 428/690 |
| 2005/0077817 A1* | | 4/2005 | Yamazaki et al. ........... 313/504 |
| 2005/0186446 A1* | | 8/2005 | Shitagaki et al. ............ 428/690 |
| 2007/0085470 A1* | | 4/2007 | Ando et al. ................. 313/503 |

FOREIGN PATENT DOCUMENTS

| | | |
|---|---|---|
| JP | 7-122365 | 5/1995 |
| JP | 9-260060 | 10/1997 |
| JP | 2001-185358 | 7/2001 |
| JP | 2004-075464 | 11/2004 |
| WO | WO 02/091814 A2 | 11/2002 |

OTHER PUBLICATIONS

Chinese Office Action issued in Patent Application No. CN 2005800183675 dated on Jun. 6, 2008.

* cited by examiner

ELECTROLUMINESCENT DEVICE WITH ACETYLACETONATO COMPLEX SALT INCLUDED IN PHOSPHOR LAYER

RELATED APPLICATIONS

This application is a national phase of PCT/JP2005/010243 filed on Jun. 3, 2005, which claims priority from Japanese Application No. 2004-168168 filed Jun. 7, 2004, the disclosures of which Applications are incorporated by reference herein. The benefit of the filing and priority dates of the International and Japanese Applications is respectfully requested.

BACKGROUND

1. Technical Field

The present invention relates to an electroluminescent device, and specifically to an electroluminescent device using an inorganic phosphor material.

2. Description of the Related Art

In recent years, electroluminescent devices (hereinafter, referred to as an EL device) receive attention as a surface-emitting device of a light weight and a low-profile. The EL devices are broadly divided into an organic EL device using an organic phosphor material as a phosphor material and an inorganic EL device using an inorganic phosphor material as a phosphor material. Among others, dispersion type inorganic EL devices (hereinafter, referred to as a dispersion type EL device), in which a phosphor layer is formed by a screen printing method or the like using a phosphor material paste, receive attention since they have advantages that power consumption is low and further a manufacturing cost is low because of easy manufacturing. The dispersion type EL devices, however, had a problem that they cannot be applied to displays such as a television set requiring high luminance due to low luminance brightness.

And so, there have been proposed various approaches in order to resolve this issue. For example, in Japanese Patent Laid-open Publication No. 2001-185358, there is disclosed a dispersion type EL device in which higher luminance is realized by increasing a voltage applied to a phosphor layer by enhancing a dielectric constant of a layer of a phosphor material using a phosphor material coated with $PbTiO_3$.

DISCLOSURE OF THE INVENTION

However, since conventional dispersion type EL devices were low in the luminance brightness of a phosphor material itself, they had a problem with the luminance brightness compared with a liquid crystal display or a plasma display. That is, it is an object of the present invention to provide an EL device which resolves such a conventional problem to realize higher luminance.

An EL device of the present invention realizes higher luminance by constructing a phosphor layer so as to contain an acetylacetonato complex salt in an electroluminescent device having a phosphor layer including a phosphor material and a pair of electrodes for applying a voltage to the phosphor layer.

The EL device of the present invention further realizes higher luminance by applying a voltage of alternating current to a phosphor layer to provide a high electric field for the phosphor layer.

It still further realizes higher luminance by using zinc sulfide of which a metal atom is activated as a phosphor material to enhance the luminance of a phosphor material itself.

Also, it enhances the luminance brightness more by using an acetylacetonato complex salt, in which ligands coordinate with any metal atom of aluminum (Al) or yttrium (Y) as acetylacetonato complex salt to improves a luminescent characteristic of the phosphor layer.

In accordance with the present invention, the luminance brightness of the phosphor layer can be amplified, and therefore the EL device having high luminance can be realized.

BRIEF DESCRIPTION OF THE DRAWINGS

The present invention will become readily understood from the following description of preferred embodiments thereof made with reference to the accompanying drawings, in which like parts are designated by like reference numeral and in which.

BEST MODE FOR CARRYING OUT THE INVENTION

The embodiments in accordance with the present invention will be described by way of FIG. 1 and FIG. 2.

Figure 1:
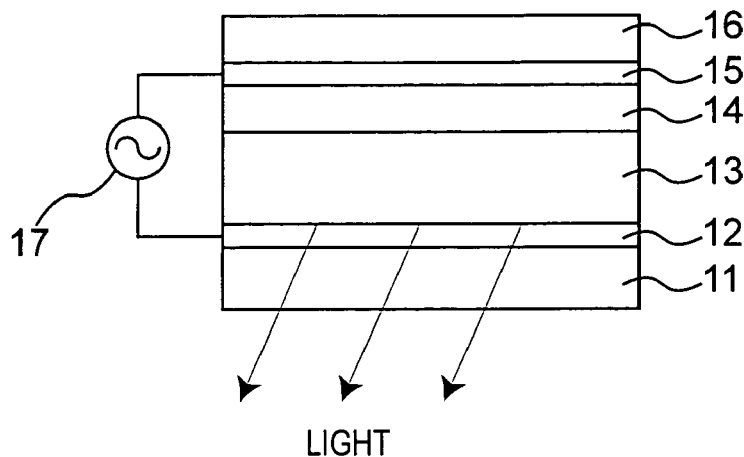
FIG. 1 is a constitutional section view schematically showing a cross section of an EL device according to the present invention.

FIG. 1 is a sectional view schematically showing a cross section of an EL device according to the present invention. This EL device is constructed by laminating respective constituents of a transparent substrate 11, a transparent electrode 12, a phosphor layer 13 containing a phosphor material and acetylacetonato complex salt, an insulating layer 14, a back electrode 15 and a back plate 16 for protecting the back electrode 15 one after another. When a voltage of alternating current is applied between the transparent electrode 12 and the back electrode 15 with an alternating power source 17, the phosphor layer 13 emits light.

As a transparent substrate 11 applicable to the present invention, any substrate can be applied as long as it is a light transmitting substrate used in normal EL devices. For example, plastic substrates such as polyethylene terephthalate, polyethylene, polypropylene, polyimide and polyamide, glass substrate and quartz substrate can be used.

As a transparent electrode 15 applicable to the present invention, any electrode can be applied as long as it is a light transmitting transparent conductor generally well known. For example, there can be used metal oxides such as ITO ($In_2O_3$ doped with $SnO_2$) and ZnO, metals such as Au, Ag and Al, and electrically conductive polymers such as polyaniline, polypyrrole, PEDOT/PSS and polythiophene.

As a phosphor material applicable to the present invention, there can be employed, for example, compounds of Groups II to VI such as zinc sulfide and calcium sulfide, thiogallate compounds such as calcium thiogallate, thioaluminate compounds such as barium thioaluminate, metal oxides such as yttrium oxide and gallium oxide, fluorescent substances of multinary oxides such as $Zn_2SiO_4$ and the like, or fluorescent substances of which a metal atom, such as manganese, is activated. Among others, fluorescent substances of which a metal atom is activated are preferred in that the luminance brightness of a phosphor material itself is high.

As acetylacetonato complex salt applicable to the present invention, there can be employed a compound expressed by the following structural formula (1):

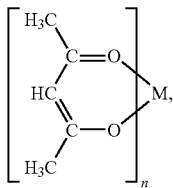

(1)

wherein n is a coordination number and M is a metallic atom or a compound including a metallic atom such as metal oxides. In addition, a general formula is $M(C_5H_7O_2)_n$.

Specifically, there can be used acetylacetonato complex salt in which n is 1 and M is any one of K, Li and Na, n is 2 and M is any one of Ba, Be, Ca, Cd, Co, Cu, Mg, Mn, Ni, Pb, Pd, Pt, Sn, Sr, VO, Zn, $MoO_2$ and TiO, n is 3 and M is any one of Al, Ce, Co, Cr, Dy, Er, Eu, Fe, Ga, Gd, In, La, Mn, Nd, Pr, Rh, Ru, Sc, Sm, Tb, Tm, V, Y and Yb, or n is 4 and M is any one of Hf and Zr. Hydrates thereof can also be used.

As another acetylacetonato complex salt, there can be employed compounds expressed by the following structural formulas (2) and (3):

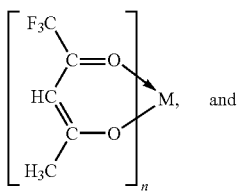

(2) and

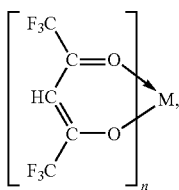

(3)

which are formed by substituting fluorine for hydrogen of the structural formula (1).

For example, $Cu(C_5H_4F_3O_2)_2$ and $Cu(C_5HF_6O_2)_2$ can be applied.

As another acetylacetonato complex salt, there can be employed a compound in which M is an alkyl group such as $Sn(C_4H_9)_2(C_5H_7O_2)_2$ or a compound in which M is a chloride such as $Sn(C_5H_7O_2)_2Cl_2$.

As further acetylacetonato complex salt, there can be employed compounds of which a general formula is expressed by $M(C_5H_7O_2)_nX$ wherein X is a monovalent anion. For example, there can be applied $[B(C_5H_7O_2)_2]AuCl_2$, or a compound having a hydroxyl group such as $Ca(C_5H_7O_2)_2(OH)_2$ and $Ba(C_5H_7O_2)_2(OH)_2$.

According to the present inventor's experiments, among the compounds described above, the acetylacetonato complex salt, which has a coordination number n of 3 and ligands coordinating with a trivalent metal atom, is preferred in that an effect of enhancing the luminance brightness is large. The acetylacetonato complex salt, in which ligands coordinate with a metal atom of Group III or Group XIII, is more preferred, and among others, the acetylacetonato complex salt, in which ligands coordinate particularly with aluminum (Al) or yttrium (Y), is extremely effective for realizing higher luminance.

A method of forming the phosphor layer 13 is not particularly limited but a method, in which the fluorescent substance and acetylacetonato complex salt are dispersed in a resin binder such as cyanoethylcellulose and polyvinylidene fluoride and this dispersion is applied, is simple. As an application method, there are given spin coating, an ink-jet method, a screen printing method, bar coating, dip coating and the like. In addition, the phosphor layer 13 may contain dye or a compound for converting color in response to purpose.

The insulating layer 14 is composed of insulative organic matter or a substance formed by dispersing this organic matter in a nonconductive polymer such as cyanoethylcellulose, polyvinylidene fluoride, a polystyrene resin and a polyvinylpyridine resin. As the insulative organic matter, there can be used $SiO_2$, $Si_3N_4$, SiON, $Al_2O_3$, $Y_2O_3$, $BaTiO_3$, $SrTiO_3$ and $CaTiO_3$. Among other $BaTiO_3$ and $SrTiO_3$ are preferred from the viewpoint of a high dielectric constant. Further, the insulating layer 14 may include two or more stacked insulators as required. Next, the layer thicknesses of the phosphor layer 13 and the insulating layer 14 will be described.

With respect to performance required of the EL device, it is desired to simultaneously realize the reduction of a driving voltage for light emission and higher luminance. The following equations (1) and (2) show relationships among the driving voltage Va for light emission applied between the transparent electrode 12 and the back electrode 15, a voltage Vp applied to the phosphor layer 13 and a voltage Vi applied to the insulating layer 14. As is apparent from the equations (1) and (2), it is necessary to design each layer thickness in consideration of a withstand voltage and a dielectric constant of the phosphor layer 13 and the insulating layer 14 in order to reduce the driving voltage Va for light emission and realize higher luminance. According to the present inventor's experiments, it is good that the layer thickness of the phosphor layer 13 is within a range of 20 to 80,000 nm and preferably within a range of 50 to 40,000 nm. And, it is good that the layer thickness of the insulating layer 14 is within a range of 50 to 80,000 nm and preferably within a range of 100 to 50,000 nm.

$$Vp = \in i \cdot dp/(\in i \cdot dp + \in p \cdot di) \cdot Va \quad (1)$$

$$Vi = \in p \cdot di/(\in p \cdot di + \in i \cdot dp) \cdot Va \quad (2)$$

In the above equation, $\in i$ is a dielectric constant of the insulating layer, $\in p$ is a dielectric constant of the phosphor layer, di is a layer thicknesses of the insulating layer and dp is a layer thicknesses of the phosphor layer.

As a back electrode 15 applicable to the present invention, any electrode can be applied as long as it is a generally well-known conductor. For example, there can be used metal oxides such as ITO and ZnO, metals such as Au, Ag, Al and Cu, electrically conductive polymers such as polyaniline, polypyrrole and PEDOT/PSS, and electrically conductive carbon.

As a back plate 16 applicable to the present invention, any plate can be applied as long as it has high mechanical strength and is electrically insulative. For example, polymers such as polyethylere terephthalate, polyethylene, polypropylene, polyimide, polyamide and nylon, glass, quartz and ceramic can be used. As a method of forming the back plate 16, a method, which is appropriately selected from application methods such as spin coating, an ink-jet method, a screen printing method, bar coating, dip coating and the like, and a bonding method in response to materials to be used, may be employed.

Further, FIG. 1 shows a structure in which light is taken out from one side, but the present invention is not limited to the above embodiment and for example in the case of taking out light from both sides, this can be easily achieved by constructing the insulating layer 14, the back electrode 15 and the back plate 16 from a material which luminous wavelength of the phosphor material can pass through.

EXAMPLES

Hereinafter, the present invention will be described in more detail by way of specific examples.

Example 1

An EL device 16 having a structure shown in FIG. 1 was prepared by the method described below. A PET film was used as a transparent substrate 11 and ITO was deposited onto the PET film by sputtering to form a transparent electrode 12. Next, a phosphor material past formed by dispersing and mixing the compositions shown below was screen-printed on the transparent electrode 12 and dried at 120° C. to form a phosphor layer 13 with a layer thickness of 25,000 nm.

Fluorescent substance: 10 parts by weight of a green luminous fluorescent substance produced by OSRAM SYLVANIA Inc.

Acetylacetonato complex salt: 1 part by weight of (triacetylacetonato)yttrium

Resin binder: 10 parts by weight of a mixture of acrylic acid and vinylidene fluoride Next, fine particles of $BaTiO_3$ were dispersed in a resin binder containing a mixture of acrylic acid and vinylidene fluoride, and this dispersion was screen-printed on the phosphor layer 13 and dried at 120° C. to form an insulating layer 14 with a layer thickness of 30,000 nm.

Next, a carbon paste was screen-printed on the insulating layer 14 to form a back electrode 15, and then a polyimide-based photosensitive resin was applied onto the back electrode 15 and cured by photocuring to form a back plate 16 to obtain an EL device.

Figure 2:
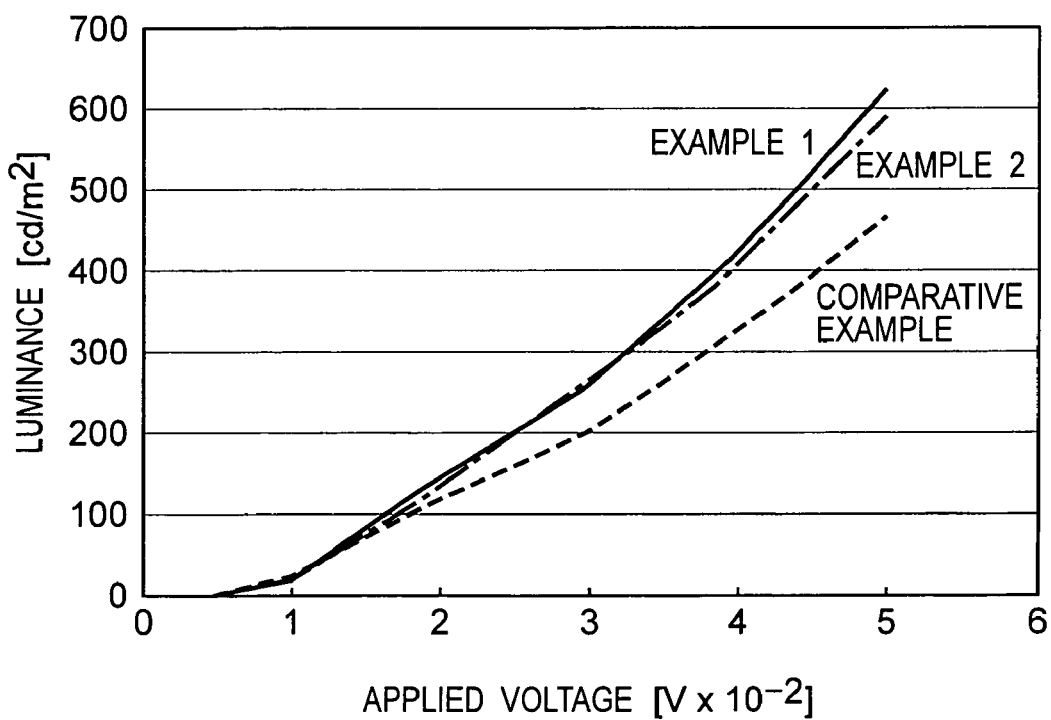
FIG. 2 is a comparative graph of luminance brightness of the EL devices according to the present invention and Comparative Example.

A voltage of alternating current was applied to this EL device, and the luminance brightness was measured and it was found, as shown in FIG. 2, higher luminance brightness than that of Comparative Example described later could be obtained.

Example 2

An EL device was prepared in the same procedure as in Example 1 except that (triacetylacetonato)aluminum was used as the acetylacetonato complex salt. The luminance brightness of this EL device was measured and it was found higher luminance brightness than that of Comparative Example could be obtained.

Comparative Example

In order to investigate the effect of acetylacetonato complex salt, an EL device to which acetylacetonato complex salt was not added was prepared in the same procedure as in Example 1 and the luminance brightness was compared between this device and those in Examples 1 and 2.

As the results, as is apparent from FIG. 2, it was found that the EL device according to the present invention has higher luminance brightness than that of Comparative Example and acetylacetonato complex salt is extremely effective for realizing higher luminance.

INDUSTRIAL APPLICABILITY

Because of high luminance brightness and further low-cost, it can be applied to surface-emitting sources of a display mounted on a digital camera, a mobile phone, a personal digital assistant, a personal computer, a television set and an automobile and a backlight of a liquid crystal display.

The invention claimed is:

1. An electroluminescent device comprising:
   a phosphor layer including a phosphor material; and
   a pair of electrodes for applying a voltage to said phosphor layer, wherein
   the phosphor layer includes an inorganic compound as a phosphor material, an acetylacetonato complex salt, and a resin binder, which are dispersed each other in the phosphor layer.

2. The electroluminescent device according to claim 1, wherein a voltage of alternating current is applied between the pair of electrodes.

3. The electroluminescent device according to claim 1, wherein said inorganic compound is a zinc sulfide of which a metal atom is activated.

4. The electroluminescent device according to claim 1, wherein said acetylacetonato complex salt is an acetylacetonato complex salt in which a trivalent metal atom is coordinated.

5. The electroluminescent device according to claim 4, wherein said trivalent metal atom is either a metal atom of Group III or a metal atom of Group XIII.

6. The electroluminescent device according to claim 5, wherein said trivalent metal atom is either aluminum or yttrium.

* * * * *